US006255163B1

(12) United States Patent
Zatelli et al.

(10) Patent No.: US 6,255,163 B1
(45) Date of Patent: Jul. 3, 2001

(54) PROCESS FOR MANUFACTURING SELECTION TRANSISTORS FOR NONVOLATILE SERIAL-FLASH, EPROM, EEPROM AND FLASH-EEPROM MEMORIES IN STANDARD OR AMG CONFIGURATION

(75) Inventors: Nicola Zatelli, Bergamo; Cesare Clementi, Busto Arsizio; Carlo Cremonesi, Vaprio D'Adda; Federico Pio, Brugherio, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/330,540

(22) Filed: Jun. 11, 1999

(30) Foreign Application Priority Data

Jun. 12, 1998 (IT) .............................................. TO98A0516

(51) Int. Cl.⁷ .................................................. H01L 21/336
(52) U.S. Cl. .......................... 438/257; 438/258; 438/276; 438/303; 438/586
(58) Field of Search ................................... 438/257, 258, 438/276, 201, 211, 303, 524, 700, 586; 257/296, 315, 316, 401

(56) References Cited

U.S. PATENT DOCUMENTS

| 5,140,551 | * | 8/1992 | Chiu ...................................... 257/296 |
| 5,436,478 | * | 7/1995 | Bergemont ............................ 257/316 |
| 5,707,884 | * | 1/1998 | Fontana et al. ....................... 438/258 |
| 5,808,937 | * | 9/1998 | Chi et al. ......................... 365/185.33 |

FOREIGN PATENT DOCUMENTS

0926686-A1 * 6/1999 (EP) .............................. G11C/16/04

* cited by examiner

Primary Examiner—Matthew Smith
Assistant Examiner—Igwe U. Anya
(74) Attorney, Agent, or Firm—Theodore E. Galanthay; Robert Iannucci; Seed IP Law Group PLLC

(57) ABSTRACT

The driving capability of a selection transistor is increased by an N-type implant at the source and drain regions of the selection transistor itself. This implant is conveniently made at the end of the self-aligned etching, using the same self-aligned etching mask defining the control gate regions and the floating gate regions of memory elements, keeping the circuitry area covered by a circuitry mask.

18 Claims, 2 Drawing Sheets

PROCESS FOR MANUFACTURING SELECTION TRANSISTORS FOR NONVOLATILE SERIAL-FLASH, EPROM, EEPROM AND FLASH-EEPROM MEMORIES IN STANDARD OR AMG CONFIGURATION

TECHNICAL FIELD

The present invention regards a process for manufacturing selection transistors for nonvolatile serial-flash, EPROM, EEPROM and flash-EEPROM memories in standard or Alternate Metal Ground (AMG) configurations.

BACKGROUND OF THE INVENTION

As known, in nonvolatile memories of the above indicated type, even multilevel programmable ones, there is an N-channel selection transistor arranged in series with a memory element or with a bit line connected to a plurality of memory cells. In particular, in the case of serial-flash memories, the selection transistor acts as a selector for enabling or not enabling a memory array partition; in flash-EEPROM memories in AMG and standard configurations and in EPROM memories, the selection transistor belongs to the column decoder which allows the addressed column to be biased at set potentials.

In all the above cases, the selection transistor must have a good driving capability of the cells connected thereto. This characteristic is fundamental so as to avoid limitations on the output current of the selected memory cell. Any current limitations on the one hand reduce the operating window of the cells and on the other hand increase the operating times necessary to perform the different tests implemented in memory devices.

SUMMARY OF THE INVENTION

An advantage of the present invention is devising a manufacturing process that allows obtaining selection transistors with a better driving capability than those that may presently be obtained with standard processes.

According to embodiments of the present invention, a process is provided for manufacturing selection transistors for nonvolatile serial-flash, EPROM, EEPROM and flash-EEPROM memories in standard or AMG configurations that includes forming an N-channel selection transistor having gate, drain and source regions and implanting an N-type dopant alongside the gate region that is separate from the step that forms the source and drain regions. The invention also includes a nonvolatile memory formed by this process.

BRIEF DESCRIPTION OF THE DRAWINGS

The invention will now be described with reference to the enclosed drawings, which show non-limiting embodiments.

DETAILED DESCRIPTION OF THE INVENTION

Figure 1:
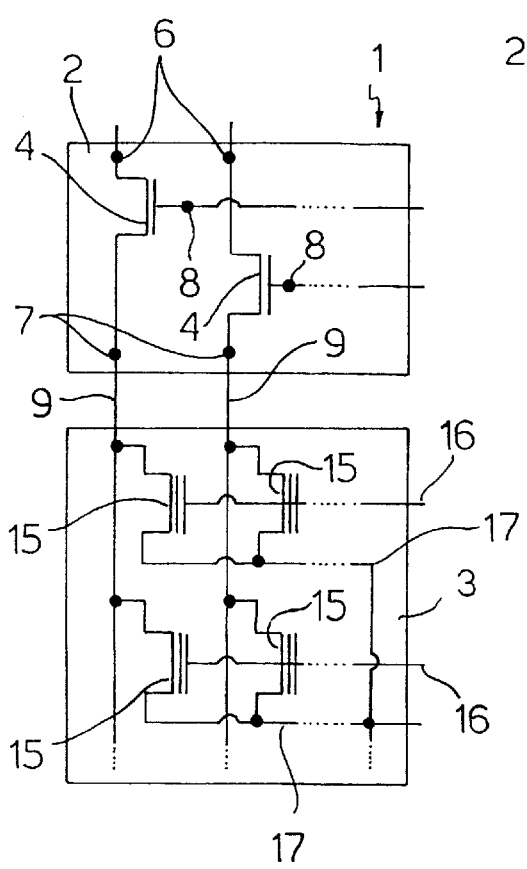
FIG. 1 shows a simplified diagram related to a flash EEPROM or EPROM memory of a known type.

FIG. 1 shows a simplified diagram of a nonvolatile memory 1, of the flash EEPROM or EPROM type, where only the elements needed to represent embodiments of the present invention are schematically shown. In detail, memory 1 comprises a column decoder 2 and a memory array 3; the column decoder 2 comprises a plurality of N-channel selection transistors 4 with an input (drain) terminal 6; an output (source) terminal 7 connected to a respective bit line 9; and a control (gate) terminal 8 for turning the individual selection transistor on. The memory array 3 includes in turn a plurality of memory cells 15, having the drain terminal connected to a respective bit line 9, the gate terminal connected to a word line 16 and the source terminal connected to a respective source line 17.

Figure 2:
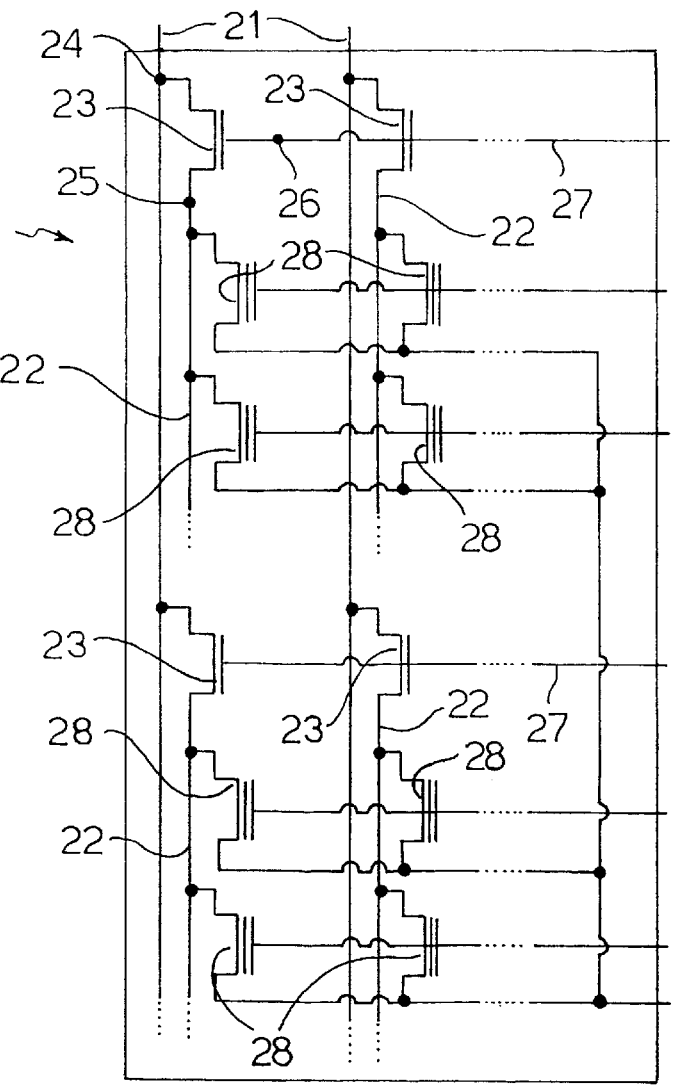
FIG. 2 shows a simplified diagram concerning a serial-flash memory of a known type.

FIG. 2, instead, shows the simplified diagram of a serial-flash memory 19, wherein the memory array 20 comprises a number of global bit lines 21, each connected to a plurality of local bit lines 22 through a respective N-channel selection transistor 23. Each selection transistor 23 shows an input terminal 24 connected to a respective global bit line 21, an output terminal 25 connected to a respective local bit line 22 and a control terminal 26 connected to a respective selection line 27. The selection transistors 23 arranged on the same column are connected to the same global bit line 21 and each controls its own local bit line 22; the selection transistors 23 arranged on the same line are connected to the same selection line 27. Memory cells 28 are connected to local bit lines.

Figure 3:
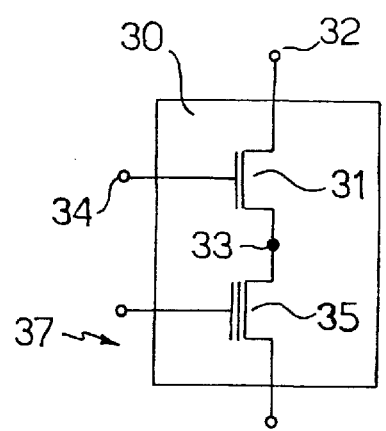
FIG. 3 shows the simplified electric diagram of an EEPROM memory cell.

FIG. 3 shows the simplified electric diagram of a cell 30 belonging to an EEPROM memory 37 and including a selection transistor 31, having an input terminal 32, an output terminal 33 and a control terminal 34; the selection transistor 31 is arranged in series to a memory transistor 35.

In all three above-mentioned cases, the driving capability of the selection transistor 4, 23 or 31 can be increased by adding an N-type implant at the source and drain regions of the selection transistor 4, 23 and 31 itself. This implant is conveniently made at the end of a self-aligned etching (which is well known in the art), using the same self-aligned etching mask for defining the array as regards the interpoly dielectric layer and the floating gate, keeping the circuitry area covered, as described below in greater detail. In the below-described detail, an example is given with reference to a process for manufacturing an EEPROM memory, a cell of which has been described above with reference to FIG. 3.

Figure 4:
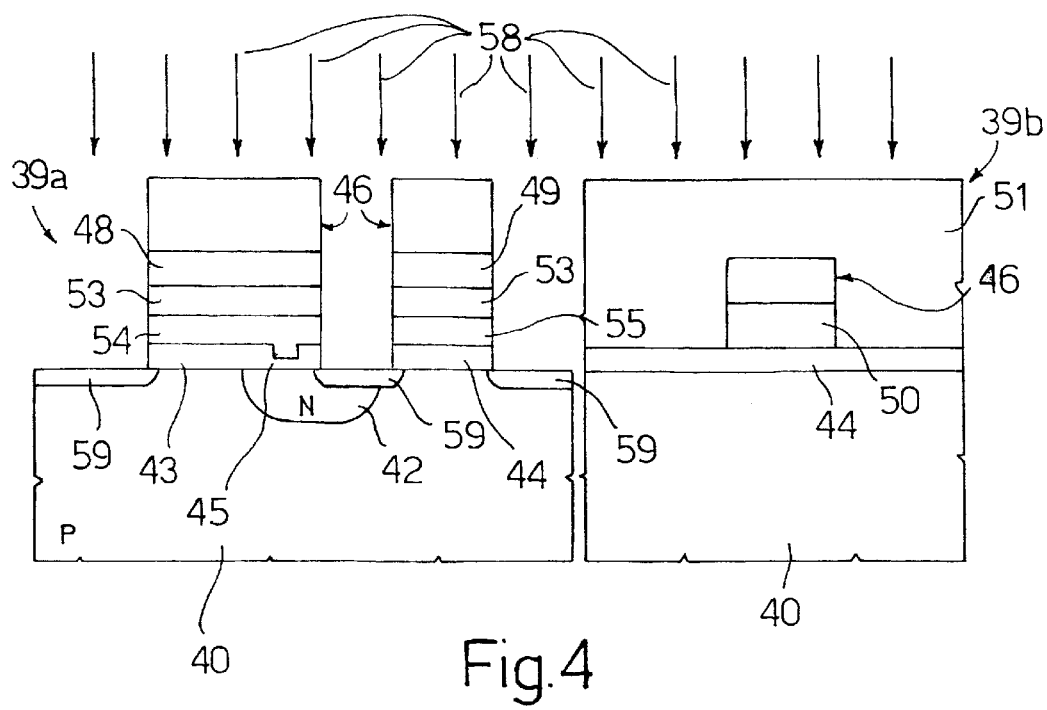
FIG. 4 shows a cross section of an EEPROM cell and a circuitry transistor during a step of the present process.
Figure 5:
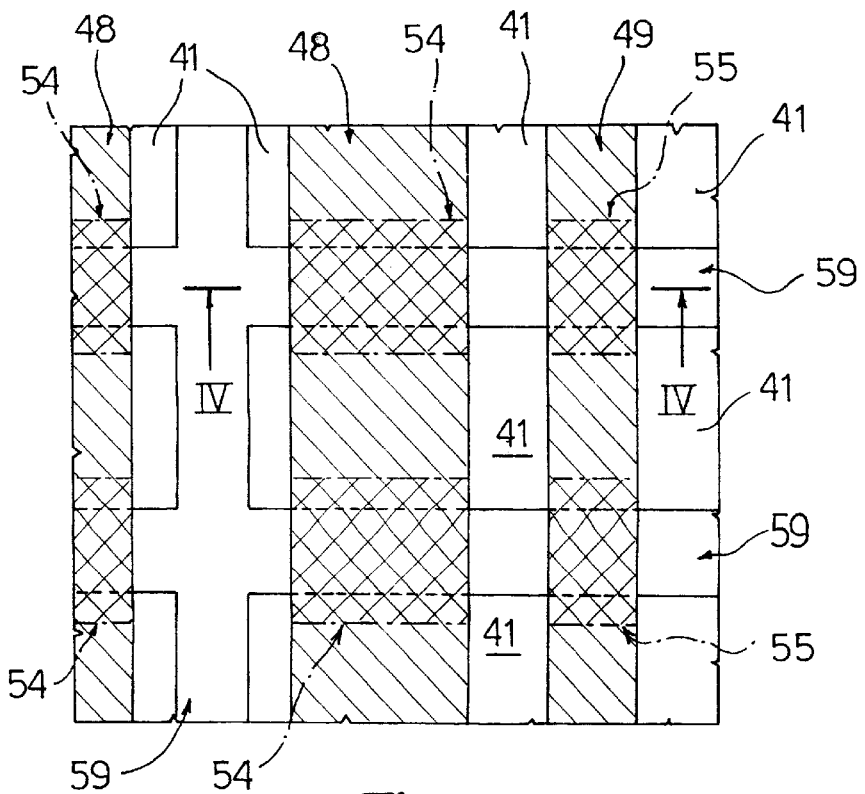
FIG. 5 shows a top view of the cell of FIG. 4.

FIG. 4 shows, on the left-hand side, part of the array area 39a, which is the chip portion in which the memory array is formed, and on the right-hand side, part of the circuitry area 39b, which is the chip portion in which the memory operation control circuitry components are formed. According to a manufacturing process, starting from a P-type substrate 40 and using a nitride active area mask, which covers the active memory areas, field oxide regions 41 are grown, see FIG. 5. A capacitor implant is then made, leading to the formation of an N-type continuity region 42. Gate oxide layers are then formed to create gate oxide layers 43 of memory transistors 35 and gate oxide layers 44 of selection transistors 31 and gate oxide layers 44 of circuitry transistors. The gate oxide layer of the memory transistors 35 is selectively removed at the portions where tunnel regions must be formed and tunnel oxide regions 45 are grown, surrounded by the respective gate oxide layer.

There then follow the steps of: depositing and doping a first polycrystalline silicon layer (poly1); defining the poly1 to delimit the width (vertical direction of FIG. 5) of the floating gate regions, by means of a poly1 mask not shown; depositing a interpoly dielectric layer(for example ONO, formed by overlapping silicon oxide—silicon nitride—silicon oxide); removing the ONO layer from the circuitry area 39b; depositing (and possibly doping) a second polycrystalline silicon layer (poly2) and possibly depositing a silicide layer; the poly2 layer and the silicide layer, in the circuitry area 39b, are short-circuited with the poly1 layer. Later, using a resist mask (poly2 mask 46), the double silicide and poly2 layer is etched, thereby defining the control gate strips 48 of memory transistors 35 and the upper portions 49 and 50 of gate regions of selection transistors 31 and circuitry transistors respectively, short-circuited to the poly1 layer at the circuitry zone 39b, in a way known and published in the prior art, but not shown here for simplicity, see U.S. Pat. Nos. 5,464,784 and 5,798,279 as possible examples in the prior art. This etching ends automatically, as known, on the ONO layer.

Next, the circuitry area 39b is covered with a self-aligned resist mask 51 and also using the poly2 mask 46, the self-aligned etching of the ONO, poly1 and gate oxide layers is carried out, obtaining interpoly dielectric regions 53, floating gate regions 54 of memory transistors and lower portions 55 of gate regions of selection transistors and the above-mentioned gate oxide regions 43 and 44.

According to the teachings of the present invention, a phosphorous or arsenic implant is made with a suitable dose for example between $1.1 \times e^{12}$ and $1.7 \times e^{12}$ atoms /cm$^2$ at an implant energy between 10 and 50 keV, as symbolized in FIG. 4 by arrows 58. This implant is made with the self-aligned resist mask 51 and 46 still in place and thus leads to the accumulation of N ions in the uncovered portions of substrate 40, only in the array area 39a (small regions 59 of FIG. 4).

Following the implant at this time and in this portion of the chip, the process then returns to continue through known steps, including removing the self-aligned mask 46 and the self-aligned circuitry mask 51. The further process steps may include growing a protective oxide layer above the control gate regions 48 and the gate regions 49, 50. After this, the process also includes forming the source and drain regions by conventional techniques. The source and drain regions may be of the LDD type including firstly lightly implanting drain/source, forming spacers at the side of the control gate and floating gate regions of memory transistor 35 and, where contemplated, implanting source/drain, and final steps for forming a covering layer of dielectric, of contacts, and a passivation layer.

One feature of the invention is that of performing an additional implant using the self-aligned etching mask 46 that covers the circuitry. This implant is carried out at the end of the self-aligned etching, using the same mask that covers the circuitry; thus it does not affect the circuitry transistors without additional costs with respect to previous processes. Indeed, the present implant may be additional to the conventional LDD implant (generally carried out only on circuitry transistors; however, when the conventional LDD implant is carried out also in the array, it sums to this implant).

The above-described process and memory show the following advantages. First of all, the above-described implant enables obtaining enriched regions at source and drain regions of selection transistors which increase the driving capability of the transistors, eliminating the problems of output current limitation of the above-mentioned cells. Making such implant at the end of the self-aligned etching step allows improving the electric driving characteristics of the selection transistors without requiring additional masks with respect to the known manufacturing processes and does not alter the performance of the memory control circuitry. At the memory transistors, the self-aligned implant enriches the source and drain diffusions. It increases the dopant in the implanted areas; therefore it reduces the series resistance of the transistor or shortens the channel length, thereby the transistor has a higher ability of drawing current.

Finally it is clear that modifications and variations can be made to the process and memory described and shown therein, without departing from the scope of this invention, as defined in the enclosed claims.

What is claimed is:

1. A process for manufacturing selection transistors for nonvolatile serial-flash, EPROM, EEPROM and flash-EEPROM memories in standard and AMG configurations, comprising:

forming an N-channel selection transistor including forming a gate region, a drain region and a source region; and forming first and second enriched regions at the source and drain regions respectively, by implanting N-type doping species along opposite sides of said gate region, separately from forming the source and drain regions.

2. The process according to claim 1 wherein forming a gate region comprises forming a layer stack including a first semiconductor material layer, an interpoly dielectric layer and a second semiconductor material layer and defining said layer stack using a first selective covering mask, and wherein the implanting N-type doping species is carried out through the first selective covering mask after defining said layer stack using said first selective covering mask.

3. The process according to claim 2 wherein defining said layer stack comprises:

removing selective portions of said second semiconductor material layer;

covering a circuitry portion of said memory by a second selective covering mask;

removing selective portions of said interpoly dielectric layer and then removing selective portions of said first semiconductor material layer;

and wherein implanting N-type doping species is carried out while maintaining said second selective covering mask.

4. The process according to claim 1 wherein implanting N-type doping species comprises implanting ions selected between phosphorous and arsenic.

5. The method of claim 1 wherein the source and drain regions of the selection transistor are formed at the first and second enriched regions after the first and second enriched regions have been formed.

6. The method of claim 1, further comprising:

forming a memory cell transistor adjacent to the selection transistor, the memory cell transistor sharing the source region with the selection transistor, wherein forming the memory cell transistor includes forming an N-type doped continuity region that overlaps the source region and extends under a tunnel region of the memory cell transistor.

7. A nonvolatile serial-flash, EPROM, EEPROM and flash-EEPROM memory in standard and AMG configurations, comprising:

an N-channel selection transistor having a gate region, a source region, and a drain region, and including N-type first and second enriched regions laterally aligned on opposite sides of said gate region and formed separately from said source and drain regions.

8. A method of making a selection transistor for a nonvolatile memory cell, the method comprising:

on a semiconductor substrate, forming a stacked gate structure;

doping areas of the substrate immediately adjacent to the stacked gate structure with a dopant at a time other than when source and drain areas of the memory cell are formed in the semiconductor substrate; and implanting source and drain regions of the selection transistor immediately adjacent to opposite sides of the stacked gate structure after the doping step.

9. The method of claim 8 wherein forming a stacked gate structure comprises:

forming a floating gate;

forming an inter-polysilicon layer; and forming a control gate.

10. The method of claim 9 further including forming a tunnel oxide.

11. The method of claim 9 wherein after the control gate is formed, partially defining the stacked gate structure by selective etching the control gate through a mask layer.

12. The method of claim 11 wherein the doping areas of the substrate adjacent to the stacked gate structure follows defining the stacked gate structure.

13. The method of claim 8 wherein doping areas of the substrate adjacent to the stacked structure with a dopant comprises implanting Arsenic into the semiconductor substrate.

14. A non-volatile memory cell formed by:

on a semiconductor substrate, forming a stacked gate structure; and doping areas of the substrate immediately adjacent to the stacked gate structure with a dopant at a time other than when source and drain areas of the memory cell are formed; and implanting source and drain regions of the selection transistor immediately adjacent to opposite sides of the stacked gate structure after the doping step.

15. The non-volatile memory cell of claim 14 wherein forming a stacked gate structure comprises:

forming a tunnel oxide;

forming a floating gate;

forming an inter-polysilicon layer; and forming a control gate.

16. The non-volatile memory cell of claim 15 wherein after the control gate is formed, defining the stacked gate structure by selective etching the control gate, inter-polysilicon layer, and floating gate through a mask layer.

17. The non-volatile memory cell of claim 16 wherein doping areas of the substrate adjacent to the stacked gate structure follows defining the stacked gate structure.

18. The non-volatile memory cell of claim 14 wherein doping areas of the substrate adjacent to the stacked structure with a dopant comprises implanting phosphorous into the semiconductor substrate.

* * * * *